United States Patent [19]
Ooms et al.

[11] Patent Number: 5,426,382
[45] Date of Patent: Jun. 20, 1995

[54] COMPLEMENTARY LOGIC RECOVERED ENERGY CIRCUIT

[75] Inventors: William J. Ooms, Chandler; Jerald A. Hallmark, Gilbert, both of Ariz.

[73] Assignee: Motorola, Inc., Schaumburg, Ill.

[21] Appl. No.: 237,523

[22] Filed: May 3, 1994

[51] Int. Cl.⁶ .......................................... H03K 19/00
[52] U.S. Cl. ...................................... 326/95; 326/136
[58] Field of Search ............... 307/443, 451, 452, 480, 307/481

[56] References Cited

U.S. PATENT DOCUMENTS 4,521,695  6/1985  Mazin et al. .................... 307/452 X
5,066,868  11/1991  Doty, III et al. ................ 307/452 X

OTHER PUBLICATIONS

Koller & Athas, "Adiabatic Switching, Low Energy Computing, and the Physics of Storing and Erasing Information," Proceedings of Physics of Computation Workshop, Dallas, Tex. Oct. 1992.
Younis & Knight, "Practical Implementation of Charge Recovering Asymptotically Zero Power CMOS", Paper Presented at MIT, Oct. 1992.
Seitz et al, "Hot Clock NMOS" 1985 Chapel Hill Conference on VLSI, 1985.
Hinman et al.,–Recovered Energy Logic–A Highly Efficient Alternative to Today's Logi Circuits, IEEE Power Electronics Specialists Conference, Jun. 20–24, 1993, pp. 17–26.

*Primary Examiner*—David R. Hudspeth
*Attorney, Agent, or Firm*—Robert F. Hightower

[57] ABSTRACT

A circuit derives all power from a single clock input terminal and has no connections to separate power source or power sink terminals. The circuit configuration is applicable to many functions such as inverters, logic gates (NAND, NOR, etc.), and storage elements. When connected to form an inverter function, a current electrode of a first transistor is coupled to the clock input terminal and a control electrode is coupled to a signal input terminal while a second transistor has a current electrode coupled to the clock input terminal and a control electrode coupled the signal input terminal. Both transistors have a second current electrode coupled to an output of the inverter.

7 Claims, 1 Drawing Sheet

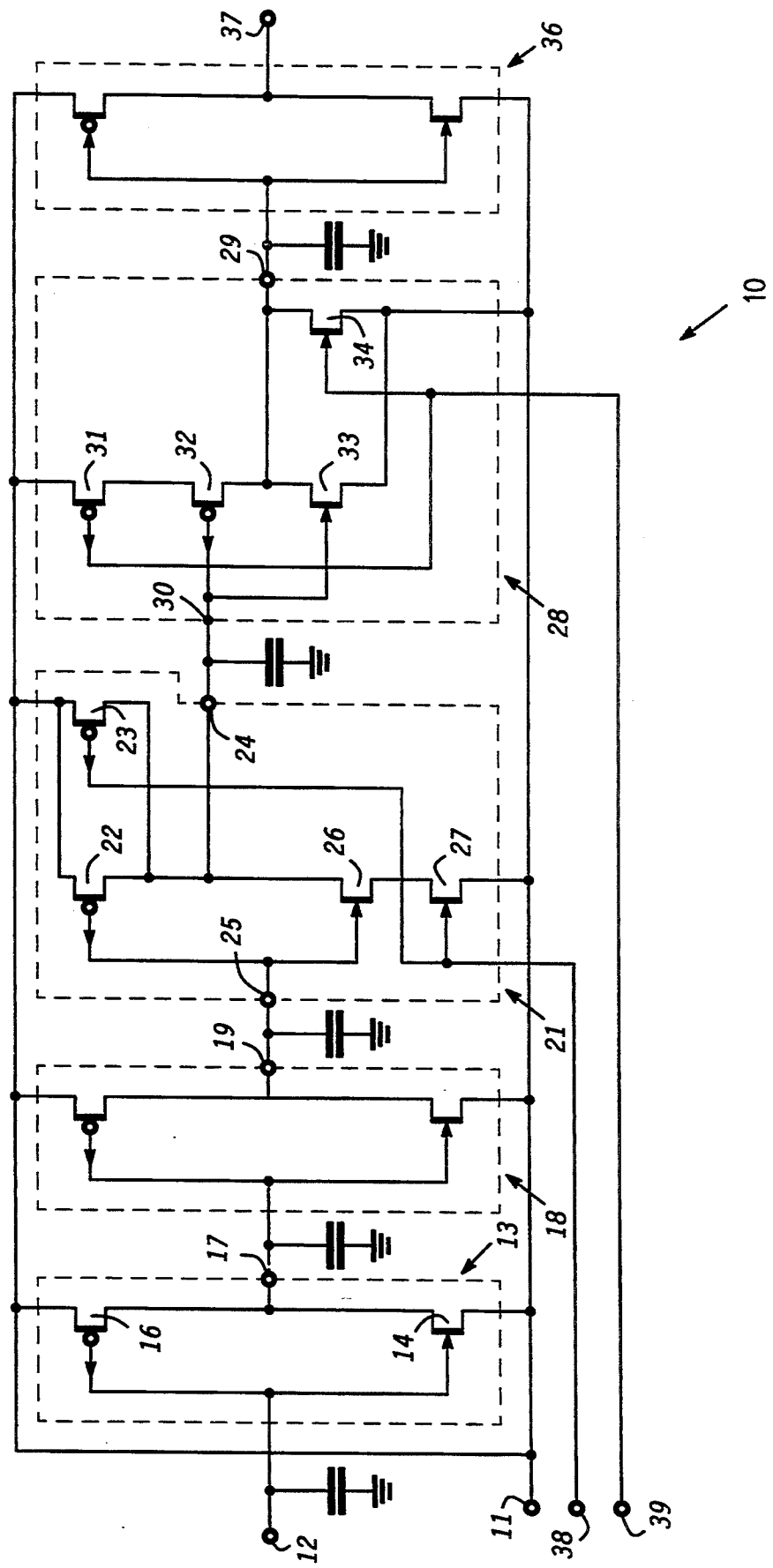

COMPLEMENTARY LOGIC RECOVERED ENERGY CIRCUIT

BACKGROUND OF THE INVENTION

The present invention relates, in general, to electronic circuits, and more particularly, to a novel recovered energy logic circuit.

In the past, a variety of circuit configurations have been utilized to reduce the amount of energy required to operate a circuit. Of particular interest are circuits referred to as recovered energy circuits. One such recovered energy logic circuit utilizes a number of bipolar transistors connected in series with alternating conductivity type, that is, PNP, NPN, PNP, etc. Each emitter is connected to a power source having an alternating waveform such as a sinusold, a triangle, or a trapezoid. The collector of each transistor is connected to the base of the following transistor and also to a capacitor that couples the collector to ground. Consequently, the collector capacitor of one transistor functions as a base or input capacitor to the following transistor.

One problem with such prior recovered energy circuits is race conditions within the circuit. During each one-half cycle, of the power source, all the transistors of one conductivity type are turned on and must discharge the capacitance on the output while simultaneously discharging the capacitance on the input. For example, during the rising portion of the power source waveform NPN transistors are turned on, and during the falling portion the PNP transistors are turned on. As a transistor turns on to charge the collector capacitor, base charge is supplied from the base or input capacitor i.e. the collector capacitor of the previous stage. If the input capacitor is discharged before the collector capacitor is completely discharged, the transistor turns off and the collector capacitor does not become fully charged. Thus, there is a race condition inherent within the circuit. Also, because of the potential drop across the base-emitter junction of a bipolar device, the input capacitor cannot be completely discharged as would be desired to provide maximum noise margin. Additionally, the switching speed of the circuit is limited. PNP transistors typically have lower switching speeds than NPN transistors. Thus, the operating frequency is limited by the switching speed of the PNP transistors.

Accordingly, it is desirable to have a recovered energy logic circuit that does not simultaneously change voltages on the input and output nodes while the circuit is active, has improved noise margin, and that has an operating frequency that is not limited by the switching rate of PNP transistors.

BRIEF DESCRIPTION OF THE DRAWINGS

The Sole FIGURE schematically illustrates a complementary logic recovered energy circuit in accordance with the present invention.

DETAILED DESCRIPTION OF THE DRAWINGS

The Sole FIGURE schematically illustrates a complementary logic recovered energy circuit 10 that can be configured to consume substantially zero energy. Circuit 10 includes a plurality of logic functions connected together in series. Circuit 10 has a clock input terminal or clock 11 that is connected as a power source terminal and power return terminal of each logic function. Consequently, circuit 10 is powered by energy from the single terminal of clock 11. This is significantly different than prior circuits that typically require at least two terminals, e.g. a power source and a power return.

A first inverter circuit or inverter 13 of circuit 10 has an input terminal 12 that also can serve as an input terminal of circuit 10. Inverter 13 includes a first transistor or upper transistor 16 which has a first current electrode or source connected to clock 11, a second current electrode or drain connected to an output terminal or output 17 of inverter 13, and a gate or control electrode connected to input terminal 12. Inverter 13 also includes a second transistor or lower transistor 14 that has a source connected to clock 11, a drain connected to output 17, and a gate or control electrode connected to input terminal 12. As illustrated in the Sole Figure, transistors 16 and 14 are P-channel and N-channel, respectively. Inverter 13 is not connected to a D.C. power source or sink, but the source of both transistors 14 and 16 is connected to clock 11. Therefore, the logic state on output 17 depends upon the state applied to clock 11 and the logic state applied to input 12.

The operation of inverter 13 depends on storing charge on parasitic or actual capacitances at input 12 and output 17. These capacitances typically are the inherent interconnect metal, gate-to-drain, gate-to-source, and drain-to-source capacitances of transistors 14 and 16. For illustration purposes, each of these capacitances is shown as a lumped equivalent capacitor. When clock 11 is high and input terminal 12 is high, transistors 14 and 16 are not enabled, and output 17 is not changed from its previous state. If clock 11 is high and input 12 is low, transistor 16 is enabled to apply a high to output 17. If clock 11 is low and input 12 is low, transistors 14 and 16 are not enabled and output 17 remains unchanged. However, if clock 11 is low and input 12 is high, transistor 14 is enabled to apply a low to output 17 and discharge any voltage stored on the parasitic capacitances attached to output 17. Thus, one complete clock cycle is required to transfer a logic state from input 12 to output 17. During this operation, circuit 13 does not change the state of the signal applied to input 12. Additionally, the frequency of the signal applied to clock 11 must be sufficiently high to prevent leakage current from discharging the parasitic capacitors before the next clock cycle can refresh the voltage stored thereon. In the preferred embodiment, the P-channel and N-channel transistors are designed to each have the same current flow. Additionally, transistors 14 and 16 are designed to have matched gate-to-source and drain-to-source parasitic capacitances.

A second complementary logic recovered energy inverter 18 has two transistors connected in a stacked fashion similar to transistors 14 and 16 of inverter 13. Thus, inverter 18 functions similarly to inverter 13. Output 17 of inverter 13 is applied to an input of inverter 18. An output 19 of inverter 18 is connected to an input 25 of a NAND function complementary logic recovered energy circuit or NAND gate 21. Upper transistors 22 and 23 are connected in parallel with each having a source connected to clock terminal 11 and a drain connected to an output 24 of gate 21. Lower transistors 26 and 27 are connected in a stacked configuration with transistor 27 having a source connected to clock 11 and a drain connected to a source of transistor 26. The drain of transistor 26 is connected to output 24. A control electrode or gate of both transistors 22 and 26 is connected to input 25 while the gate of both transistors 23 and 27 is connected to an input 38 of gate 21. The signal applied to input 38 can originate from nodes within circuit 10 or from nodes external (not shown) to circuit 10. When the signal applied to clock 11 is low, transistors 22, 23, 26 and 27 do not respond to a low signal applied to either input 25 or input 38; however, a high signal applied to inputs 25 and 38 enables transistors 26 and 27, respectively, to apply a low signal to output 24. If the signal applied to clock 11 is high, transistors 22, 23, 26, and 27 do not respond to a high signal applied to either input 25 or 38; however, a low signal applied to either input 25 or 38 enables transistors 22 or 23, respectively, to apply a high to output 24. Consequently, gate 21 performs a NAND logic function during a complete cycle of the signal applied to clock 11, and gate 21 does not change the state of the signal applied to either input 25 or 38.

Circuit 10 also includes a NOR function complementary logic recovered energy circuit or NOR gate 28. Gate 28 has an input 30 connected to output 24 of gate 21 and an input 39 that can be connected to a node within circuit 10 or other nodes (not shown) external to circuit 10. Upper transistors 31 and 32 are connected in a stacked configuration so that transistor 31 has a source connected to clock 11 and a drain connected to a source of transistor 32. A source of transistor 32 is connected to an output 29 of gate 28. Lower transistors 33 and 34 are connected in parallel with each of transistors 33 and 34 having a source connected to clock 11 and a drain connected to output 29. A control electrode or gate of both transistors 32 and 33 is connected to input 30 while a gate of both transistors 31 and 34 is connected to input 39. Transistors 31, 32, 33, and 34 are not enabled when the signal applied to clock 11 is a high and a high is applied to both inputs 30 and input 39; however, both transistors 31 anti 32 are enabled to couple a high signal to output 29 when a low signal is applied to both inputs 39 and 30. When the signal applied to clock 11 is a low, transistors 31, 32, 33, and 34 are not enabled when a low is applied to both inputs 30 and 39; however, a high signal applied to either input 30 or 39 enables transistor 33 or 34, respectively, to apply a low to output 29. Consequently, gate 28 performs a NOR logic function. Output 29 of gate 28 is connected to an input of an inverter 36 that is similar to inverter 13. Inverter 36 has an output 37 that can also be the output of circuit 10. Additionally, output 37 can be coupled to input 12 in order to form a counter.

Inverter 13, gate 21, and gate 28 are not restricted to the connections shown in circuit 10. Inverter 13, gate 21, and gate 28 can function as individual logic elements or be combined with other logic elements to form a more complex logic circuit. From the descriptions shown, it is apparent to one skilled in the art that the technique of connecting a clock signal as the power source of both the upper and lower transistors of a complementary logic function can be utilized to create any standard logic function including tristate outputs, buffers, counters, AND-OR-Invert functions, multiplexers, demultiplexers, adders, and other complementary logic functions.

By now it should be appreciated that there has been provided a novel complementary logic recovered energy circuit. By driving both a power source terminal and power sink terminal of the logic circuit with a single clock signal, energy is sourced to the circuit when the clock is high. When the clock is low, energy is returned to the clock source. The returned energy is nearly the same as the sourced energy (less resistive losses in the devices and interconnects). Thus, the energy consumed by the circuit can be significantly reduced. During transitions of signals on the circuit output, the signal or logic state applied to the input of the circuit is not changed. Consequently, race conditions within the circuit are substantially eliminated and noise margins are optimized. Utilizing matched P-channel and N-channel transistors maximizes the operating frequency of the circuit in addition to matching the positive and negative energy pulses on the clock of the circuit thereby further reducing energy consumed within the circuit.

We claim:

1. A complementary logic recovered energy circuit comprising:
    a clock input terminal;
    a signal input terminal;
    a first transistor of a first conductivity type having a first current electrode coupled to the clock input terminal, and a control electrode coupled to the signal input terminal of the recovered energy logic circuit; and
    a second transistor of a second conductivity type having a first current electrode coupled to the clock input terminal, and a control electrode coupled to the signal input terminal.

2. The complementary logic recovered energy circuit of claim 1 further including the first transistor having a second current electrode coupled to an output of the circuit, and the second transistor having a second current electrode coupled to the output of the circuit.

3. The complementary logic recovered energy circuit of claim 2 wherein the first transistor is a P-channel field effect transistor and the second transistor is an N-channel field effect transistor.

4. The complementary logic recovered energy circuit of claim 1 wherein the first transistor is devoid of a connection to D.C. power terminal and the second transistor is devoid of a connection to D.C. power terminal.

5. A complementary logic recovered energy circuit comprising:
    a clock input terminal;
    a plurality of signal input terminals:
    a first transistor of a first conductivity type having a first current electrode coupled to the clock input terminal, and a control electrode coupled to a first signal input terminal of the plurality of signal input terminals;
    a second transistor of a second conductivity type having a first current electrode coupled to the clock input terminal, and a control electrode coupled to a second signal input terminal of the plurality of signal input terminals;
    a third transistor having a first current electrode coupled to the clock input terminal, a second current electrode coupled to an output of the circuit, and a control electrode coupled to the first signal input terminal;
    the second transistor having a second current electrode coupled to the output; and
    a fourth transistor having a first current electrode coupled to the output, a second current electrode coupled to the first current electrode of the first transistor, and a control electrode coupled to the second signal input terminal.

6. A complementary logic recovered energy circuit comprising:
   a clock input terminal;
   a plurality of signal input terminals;
   a first transistor of a first conductivity type having a first current electrode coupled to the clock input terminal, and a control electrode coupled to a signal input terminal of the plurality of signal input terminals: and
   a second transistor of a second conductivity type having a first current electrode coupled to the clock input terminal; and a control electrode coupled to a signal input terminal of the plurality of signal input terminals wherein the control electrode of the first transistor is coupled to a first signal input terminal of the plurality of signal input terminals and the control electrode of the second transistor is coupled to the first signal input terminal of the plurality of signal input terminals.

7. The complementary logic recovered energy circuit of claim 6 further including a third transistor having a first current electrode coupled to the clock input terminal, a second current electrode coupled to an output of the circuit, and a control electrode coupled to a second signal input terminal of the plurality of signal input terminals;
   the first transistor having a second current electrode coupled to the output; and
   a fourth transistor having a first current electrode coupled to the output, a second current electrode coupled to the first current electrode of the second transistor, and a control electrode coupled to the second signal input terminal.

* * * * *